(12) United States Patent
Weber et al.

(10) Patent No.: US 9,097,777 B2
(45) Date of Patent: Aug. 4, 2015

(54) METHOD OF MAGNETIC RESONANCE IMAGING FOR THE SELECTION AND RECORDING OF CURVED SLICES

(75) Inventors: Hans Weber, Freiburg (DE); Maxim Zaitsev, Freiburg (DE); Daniel Gallichan, Freiburg (DE); Juergen Hennig, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 782 days.

(21) Appl. No.: 13/443,908

(22) Filed: Apr. 11, 2012

(65) Prior Publication Data
US 2012/0262171 A1 Oct. 18, 2012

(30) Foreign Application Priority Data
Apr. 15, 2011 (DE) .......................... 10 2011 007 501

(51) Int. Cl.
*G01R 33/483* (2006.01)
(52) U.S. Cl.
CPC .......... *G01R 33/4833* (2013.01); *G01R 33/483* (2013.01); *G01R 33/4835* (2013.01); *G01R 33/4836* (2013.01)
(58) Field of Classification Search
USPC .......................... 324/300–322; 600/407–435
See application file for complete search history.

(56) References Cited

U.S. PATENT DOCUMENTS

| 5,122,748 A | 6/1992 | Oh |
| 5,755,666 A | 5/1998 | Bornert |
| 6,326,786 B1 * | 12/2001 | Pruessmann et al. ......... 324/312 |
| 6,841,998 B1 * | 1/2005 | Griswold ...................... 324/309 |
| 6,983,181 B2 | 1/2006 | Hinks |
| 7,620,440 B2 | 11/2009 | Elgort |
| 2012/0262171 A1 * | 10/2012 | Weber et al. .................. 324/309 |
| 2013/0057281 A1 * | 3/2013 | Feiweier ...................... 324/309 |

FOREIGN PATENT DOCUMENTS

| WO | WO 2007/061438 | 5/2007 |
| WO | WO 2009/124873 | 10/2009 |
| WO | WO 2010/068299 | 6/2010 |

OTHER PUBLICATIONS

Boernert, Peter "2D-RF-pulse-encoded curved-slice imaging", MAGMA (2003) 16:86-92.

(Continued)

*Primary Examiner* — Melissa Koval
*Assistant Examiner* — Tiffany Fetzner
(74) *Attorney, Agent, or Firm* — Paul Vincent

(57) ABSTRACT

A method of MR imaging applies a magnetic field $B_{grad1}$ having a spatially non-linear dependence to select a volume of at least one curved slice. The slice is described by its midsurface $A_M$, a volume of the selected slice being made up of nv partial volumes in each of which gradients of at least one pair of remaining superimposed magnetic fields $B_{gradi}$ (i>1) exhibit an angle dependence of 70° to 110° with respect to one another and with respect to the normal of the midsurface $A_M$. At least one superimposed magnetic field of the respective pair exhibits a spatially non-linear dependence and combinations of these pairs are used for spatial encoding. In this way, curved surfaces can be mapped efficiently in high resolution and the method can be adapted to the slice shape.

21 Claims, 5 Drawing Sheets

(56) References Cited

OTHER PUBLICATIONS

Gallichan, Daniel et al., "Simultaneously Driven Linear and Nonlinear Spatial Encoding Fields in MRI", Magnetic Resonance in Medicine 65:702-714 (2011).

Stockmann, Jason P. et al., "0-Space Imaging: Highly Efficient Parallel Imaging Using Second-Order Nonlinear Fields as Encoding Gradients With No Phase Encoding", Magnetic Resonance in Medicine 64:447-456 (2010).

Schultz, Gerrit et al., "Reconstruction of MRI Data Encoded With Arbitrarily Shaped, Curvilinear, Nonbijective Magnetic Fields", Magnetic Resonance in Medicine 64:1390-1404 (2010).

Jochimsen, Thies H. et al., "Single-shot curved slice imaging", Magnetic Resonance Materials in Physics, Biology and Medicine 14 (2002) 50-55.

Boernert, Peter et al., "Curved Slice Imaging", MRM 36:932-939 (1996).

Wu, Ed X. et al. "A New 3D Localization Technique Using Quadratic Field Gradients", MRM 32:242-245 (1994).

C.H. et al. New Spatial Localization Method Using Pulsed High-Order Field Gradients (SHOT: Selection with High-Order gradienT), Magnetic Resonance in Medicine 18, 63-70 (1991).

S.Y. et al. "Localized Volume Selection Technique Using an Additional Radial Gradient Coil", Magnetic Resonance in Medicine 12, 56-63 (1989).

* cited by examiner

METHOD OF MAGNETIC RESONANCE IMAGING FOR THE SELECTION AND RECORDING OF CURVED SLICES

This application claims Paris Convention priority of DE 10 2011 007 501.1 filed Apr. 15, 2011 the complete disclosure of which is hereby incorporated by reference.

BACKGROUND OF THE INVENTION

The invention relates to a method of MR (=magnetic resonance) imaging, wherein, using a gradient system, a magnetic field $B_{grad}$ that is variable over time and space is used for the spatial selection of a region to be imaged and for at least two-dimensional spatial encoding of the MR signals in the region to be imaged of an object to be examined, wherein the magnetic field $B_{grad}$ has $n_{lin}$ field components with a spatially linear and $n_{nonlin}$ field components with a spatially non-linear dependence, wherein $n_{lin}+n_{nonlin} \geq 1$ and $n_{lin}, n_{nonlin} \in N$, wherein the amplitude and the spatial dependence of $B_{grad}$ are controlled by means of the strength and the ratio of the amplitudes of the individual field components, wherein the RF (=radio frequency) pulse(s) is/are transmitted by an RF transmitter system with $n_S$ transmitter coils, where $n_S \in N$ and $n_S \geq 1$ and wherein the RF signal transmitted by the object to be examined is received by an RF receiver system with $n_E$ receiver coils, where $n_E \in N$ and $n_E \geq 1$.

Partial aspects of such a method are known, for example, from [1] and [2].

Magnetic resonance imaging is a non-invasive method for the spatial resolution and display of the internal structure of an object, for example, the human body. The method is based on the energy behavior of atomic nuclei in an external magnetic field, which permits excitation of the nuclear spins by means of suitable RF (=radio frequency) pulses, as well as subsequent read-out of the signals emitted by the excited nuclear spins.

The received MR signal is composed of the individual signals of all the excited spins. Spatial allocation of these signals requires that the positions of the spins be encoded in advance, during the acquisition (recording) process. For this, spatially variable magnetic fields $B_{gradi}(x,y,z)$ are superposed on the main magnetic field $B_0$. According to equation {1}, this results in a space-dependent variation of the Larmor frequency $v_L$ of the atomic nuclei, where $B(x,y,z)$ designates the magnitude of the resulting magnetic field and $\gamma$, the gyromagnetic ratio:

$$v_L(x,y,z)=B(x,y,z)/\gamma \quad \{1\}$$

Conventionally, spatial encoding is achieved using superimposed magnetic fields, termed linear gradients, in which the change of field strength in space is as linear as possible. To produce these by linear combination, gradient systems are available with three field components whose linear gradients are aligned along the x-, y-, and z-axes and are therefore orthogonal with respect to one another. Spatial encoding in either one, two, or three dimensions is performed by varying the amplitude of the gradients in the relevant spatial directions according to the known principles, either by Fourier encoding, filtered back projection, or another known method [3].

If a superimposed magnetic field ($B_{grad1}$) is produced during irradiation of the RF pulse, spatial delimitation of the excited volume results. In this process, termed slice selection, only those nuclear spins are excited whose Larmor frequency $v_L$ is within the bandwidth of the RF pulse. When conventional linear slice selection gradients are used, the selected volume has the typical shape of a planar slice. This is fully defined via its flat midsurface $A_M$ where $$B_{grad1}(A_M)=\gamma^* \text{frequency offset} \quad \{2\}$$

and its thickness, wherein the latter derives from the amplitude of the superimposed magnetic field and the bandwidth of the RF pulse. The normal of the midsurface is always aligned parallel with the linear gradient of the superimposed magnetic field $B_{grad1}$. Because the latter is produced by linear combination from a set of field components with orthogonal gradients, it can be put together to produce any orientation and positioning of the slice. The orthogonality of the gradients also enables the production of further superimposed magnetic fields $B_{gradi}$, whose gradients are perpendicular with respect to one another and with respect to the midsurface normal, and consequently ensures spatial encoding along the midsurface of the excited slice. This corresponds to a standard projection of the spin density that is perpendicular to the midsurface and therefore to a rectangular voxel volume.

The MR signal read out for the different variations of the superimposed magnetic fields is allocated to so-called k-space, wherein the position in k-space results from the strength, duration, and orientation of the switched superimposed magnetic fields. The order in which k-space points are sampled during recording is described by the trajectory of the acquisition method used. Generally, the signal components containing low-frequency information and therefore the approximate structure of the object to be mapped are encoded at the center of k-space, while the edge regions contain detailed, the higher-frequency information. The size of the field of view FOV (=Field of View) of the resulting MR image is proportional to the sampling density $1/\Delta k$ of k-space. If the FOV is too small and does not entirely cover the object to be imaged, the outer regions of the object to be imaged appear folded inward in the reconstructed MR image. These folded image components are termed aliasing.

In the case of one-dimensional acquisition, only one row in k-space has to be acquired. The superimposed magnetic field switched during acquisition is termed the read-out gradient. For a given sampling density, the resolution of an MR acquisition is therefore determined by the strength and duration of the read-out gradient. The steeper the gradient and the longer it is switched, the further from the center of k-space are the acquired points. For a two-dimensional MR acquisition, multiple k-space rows are acquired, wherein the number of rows corresponds to the number of points in the second dimension of the image. The superimposed magnetic field ("phase gradient") responsible for the so-called phase encoding is switched for a certain time interval between excitation and acquisition of the signal, wherein the gradient strength is varied accordingly for each row. The acquisition duration therefore results from the product of the number of rows and the duration TR (=Time of Repetition) for acquisition of one row. In the case of a three-dimensional MR acquisition, k-space is extended by a third dimension; for encoding, an additional phase gradient is switched in the relevant direction. The number of k-space points along each dimension, and therefore also the number of resulting voxels, is described by the matrix size. In the case of a matrix size of $N_x \times N_y \times N_z$ and row acquisition duration TR, a total acquisition time TA (=Time of Acquisition):

$$TA(3D)=N_y \times N_z \times TR \text{ therefore results for a 3D-acquisition,} \quad \{3\}$$

and correspondingly, for a 2D-acquisition with an $N_x \times N_y$ matrix:

$$TA(2D)=N_y \times TR. \quad \{4\}$$

In the usual case of an equidistantly sampled k-space, the signal density in frequency space is calculated directly by means of the iFT (=inverse Fourier transform) of the k-space signal. The subsequent transformation of the signal density into real space results from the respective spatial dependence of the superimposed magnetic field used for encoding.

One established possibility for reducing the acquisition duration is to use several receiver coils and the resulting spatial information [4]. In the parallel imaging technique SENSE [5, 6], specific k-space rows are omitted during acquisition. The acquisition duration is shortened; this is referred to as acceleration. The MR images reconstructed from the data acquired by the individual coils are however folded as a result of the reduced sampling density. Because of the varying spatial sensitivity of the individual receiver coils with which each received signal is modulated, different weighting arises in each coil image between the intensity of the image and the intensity of the aliasing caused by folding. If the sensitivity distributions of the individual coils are known, the aliasing can be described by solving a corresponding system of equations and calculated accordingly from the overall image resulting from all coil data. A further parallel imaging technique is known as GRAPPA [7, 8]: Unlike SENSE, in this case, the missing k-space rows are calculated from the additional coil information before reconstruction of the MR image.

Standard MR imaging techniques use purely linear gradient systems and permit the mapping of thin slices in any orientation and with a rectangular voxel shape. However, because of the linearity of the gradients, it is limited to the selection and encoding of planar slices. Organic structures such as are found in the spinal canal or on the surface of the brain, in particular, cannot be described by a planar slice. Complete coverage of such structures therefore necessitates the selection of a thick slice, combined with the time-consuming three-dimensional encoding or acquisition of multiple planes followed by reformatting of the individual slices. The selection and encoding of a curved slice whose shape can be adapted to the structure of the object to be examined is therefore desirable.

As early as 1989, Lee and Cho [9] demonstrated that, by using a superimposed magnetic field of shape $B_{grad1}=x^2\pm y^2-2z^2$, application of a superimposed magnetic field with a spatially non-linear dependence as the slice selection gradient permits selection of a volume that deviates from the shape of a planar slice. In this method developed for two-dimensional limitation of the selection volume, the excited, cylindrical volume was subsequently spatially resolved by time-consuming linear 3D-encoding. Oh and colleagues [1] expanded this technique by applying an additional linear gradient during irradiation of an RF refocusing pulse, so that the 3D-encoding of the cylindrical volume could be reduced to the 2D-encoding of a planar, circular slice. In further work, they [10], and Wu and colleagues [11], also demonstrated that the selection volume can be spatially shifted during the selection process by the additional application of magnetic field components with a spatially linear dependence, and that the shape of the selection volume can be altered by varying the frequency offset of the RF pulse. These early methods explicitly aim at selection of a planar slice, albeit spatially limited.

As an alternative to choosing the selection volume via the spatial dependence of the slice selection gradient, in 1996, Börnert and Schäffter [12, 13] demonstrated that the selection process can be spatially delimited using mufti-dimensional RF pulses. The selection of curved slices, whose position, orientation, and curvature can be very flexibly chosen was also explicitly demonstrated. The spatially selective excitation using mufti-dimensional RF pulses is based on irradiation of an RF pulse with a temporal dependence adapted to the shape of the volume to be selected combined with a spatially and temporally variable amplitude and orientation of the superimposed magnetic field $B_{grad1}$. The sequence of switching, including the strength, duration, and orientation of the superimposed magnetic field $B_{grad1}$ is described analogously with switching of the superimposed magnetic fields for spatial encoding by a corresponding trajectory in the (transmission) k-space. Here, too, the spatial extent of the region in which the volume to be selected is to be located is proportional to the sampling density, the resolution of the target pattern of the volume to be selected and also proportional to the number of sampling points of transmission k-space. To allow additional selective excitation along the third dimension, the transmitter k-space must be extended accordingly. Because the entire trajectory is sampled during a single transmission of the RF pulse, resolution of the target sample is usually severely restricted by the strength and switching rate of the superimposed magnetic field $B_{grad1}$ as well as the dephasing rate of the signal already excited. The longer duration of multi-dimensional RF pulses as compared with conventional, one-dimensional RF pulses increases the minimum possible echo time of the acquisitions. It additionally results in an increased sensitivity with respect to the inhomogeneities of the static magnetic field, which above all results in non-homogeneous excitation and artifacts. Moreover, the energy requirement of RF pulses, which increases with the dimension, results in a large increase in the energy deposition in the object to be examined even with two-dimensional RF pulses. SAR (specific absorption rate) limits therefore impose restrictions on the choice of pulse and thus on the slice shape. Selection by means of multi-dimensional RF pulses is therefore considerably more complex than with conventional, one-dimensional pulses and their practical application is severely limited in some cases.

Börnert and Schäffter have also demonstrated the problems associated with spatial encoding of a curved slice. Conventional encoding with linear gradients corresponds to projection of the non-planar slice onto a planar surface. The orthogonality criterion, which states that encoding gradients and surface normal must be mutually perpendicular, can therefore only be met in a few regions. The more the midsurface normal of the excited slice deviates from this, the more distorted the shape of the resulting voxel will be. This is accompanied by a reduction in the local resolution and even ambiguities if the spin densities of different regions coincide spatially. This is the case, for example, if a slice curved with an angular bend of more than 90° is projected onto a plane. To be able to separate regions superposed during projection despite this, Börnert and Schäffter [13] propose additional RF encoding of the relevant regions. In a further development of this method with refined regions, Börnert [14] demonstrates an approximation to a slice curved along the slice dimension by concatenation of N rectangular voxels of the same orientation. Encoding along the voxel chain is achieved by N-fold excitation of the voxel chain, wherein the phase is varied along the voxel chain by appropriate adaptation of the 2D RF pulse. Based on known principles, such as the Fourier transform, the voxels can subsequently be separated again. The method thus reduces the two-dimensionality of the reconstruction to one dimension. One disadvantage of this method is that, due to the nature of the method, during RF pulse encoding of a curved slice, the typical problems occur that are associated with the use of multi-dimensional pulses, such as great sensitivity to inhomogeneities of the static magnetic field or increased energy deposition in the object to be examined. Moreover, multiple irradiation of complex RF pulses means that the method is also susceptible to individual disturbances of the pulses. The resulting irregularities in encoding along the voxel chain result, for example, in intensity modulation or disturbance signals. Even if the method can theoretically be applied to encoding along both slice dimensions of a curved slice, it is limited to one curved dimension in practice: besides the problem of 3D RF pulses already mentioned, encoding an N×N "voxel carpet" would result in an N-fold increase in the acquisition duration. Moreover, although the voxels have a rectangular shape, their lateral surfaces are not usually aligned with the midsurface.

In particular, the aforementioned problem of reduced local resolution persists. Encoding along the curved slice for projection of the spin density perpendicular to its midsurface is therefore not possible with this method.

An alternative approach for encoding a slice selected with 2D RF pulses and curved along a slice dimension was proposed by Jochimsen and colleagues [15]. In their method, an approximation to the curved midsurface of the slice is achieved with multiple planes. A plane in three-dimensional k-space can be allocated to each of these planes. The k-space points are defined taking into account the sampling density necessitated by the resolution. Reconstruction along the curved slice is performed by means of numeric Fourier-integration. The main disadvantage of this method concerns the requirements with regard to slice shape: it can only be curved along one dimension and approximation to the curve by means of a polygon must be possible. The method also assumes that the contrast along the midsurface normal is constant for every point in the slice, since interference may otherwise occur between the individual planes. Moreover, every plane must be fully sampled to avoid aliasing. Because of the superposition of the individual segments, more points are therefore acquired than would be required for reconstruction of the actual curved slice. This inefficiency increases with the number of segments. In practice, only rough approximation of encoding along the curved slice can be achieved by this method.

The object of the invention is therefore to provide an MR imaging method with which curved slices can be mapped efficiently and with high resolution. The method should be adapted to the respective slice shape.

SUMMARY OF THE INVENTION

According to the invention, this object is achieved in a surprisingly simple but effective manner in that the magnetic field $B_{grad}$ is applied during a single measurement cycle from excitation to read-out of the MR signals with at least three superimposed magnetic fields $B_{gradi}$ in the region to be mapped of the object to be examined, the first superimposed magnetic field $B_{grad1}$ having a spatially non-linear dependence, the volume of at least one curved slice being selected by applying the first superimposed magnetic field $B_{grad1}$ during irradiation of one or more RF pulses, wherein the position and orientation of the curved slice, the degree of curvature and the thickness of slice along the amplitude and the spatial dependence of the first superimposed magnetic field $B_{grad1}$, the magnitude of the frequency offset and the temporal dependence of the RF pulse(s) are selected, the position, orientation, and curvature of the slice being described via midsurface $A_M$ with $B_{rad1}(A_M)$=gyromagnetic ratio γ*frequency offset and a thickness thereof defined by the respective extent of the slice along the normal of the midsurface $A_M$, with the volume of the selected slice being composed of nv partial volumes and, in each partial volume, the gradients of at least one pair of the remaining superimposed magnetic fields $B_{gradi}$ (i>1) exhibit an angle dependence of 70° to 110° with respect to one another and with respect to the normal of the midsurface $A_M$ within the partial volume, wherein at least one superimposed magnetic field of the respective superimposed magnetic field pair exhibits a spatially non-linear dependence, and combinations of these pairs are used for at least two-dimensional spatial encoding of the MR signal along the midsurface $A_M$ of the selected slice.

The invention is based on the principle that by linearly combining the spatially linear and non-linear field components, a set of at least three superimposed magnetic fields $B_{gradi}$ is produced in such a way that by switching the first magnetic field $B_{grad1}$ in combination with one or more RF pulses, a slice of the desired position, orientation, and curvature is selected and for each partial volume of the selected slice at least one pair of superimposed magnetic fields $B_{gradi}$ (i>1) exists whose gradients are aligned with respect to each other and with the normal of the midsurface $A_M$ almost perpendicular, i.e. in the range of 70° to 110°, so that, by subsequent spatial encoding with these pairs of superimposed magnetic fields, projection of the spin density within each partial volume is achieved that is almost perpendicular to the midsurface.

The advantages achieved with the invention are, in particular, that a curved surface is selected with the superimposed magnetic field $B_{grad1}$ in a fast and efficient manner, and also that, by selective combination of the further superimposed magnetic fields $B_{gradi}$ (i>1), actual spatial encoding along both dimensions of the midsurface is achieved. As in conventional multi-slice selection, packages of multiple curved slices can be selected with the inventive method, wherein the individual slices do not overlap. For reasons of clarity, however, the description below discusses only selection of one slice by way of example. The nearly perpendicular projection (70° to 110°) resulting from the inventive spatial encoding of the spin density onto the midsurface results in voxels with a nearly rectangular shape and an alignment along the midsurface. This optimizes local spatial resolution. It is especially noteworthy that, by this method, ambiguities can also be avoided, such as occur, for example, when a curved slice with a bending angle greater than or equal to 90° is projected onto a plane. Furthermore, an almost rectangular voxel shape is standard practice in conventional MR acquisitions and users are already experienced in interpreting such acquisitions. Partial volume effects can also be reduced due to the nearly perpendicular projection of the spin density onto the midsurface in the overall region of the excited slice to be mapped.

The combination of the superimposed magnetic fields $B_{gradi}$ from individual field components and the resulting ability to vary their spatial dependence also provides a high degree of flexibility in the selection of the position, orientation, and curvature of the slice to be selected in both slice dimensions. Unlike the standard method of selection of a curved slice using multi-dimensional RF pulses, there are no restrictions on the resolution; the excited volume is characterized by a smooth dependence. Shorter and simpler one-dimensional RF pulses can also be used. This not only achieves shorter echo times but the selection process is less sensitive to $B_0$ inhomogeneities, which results in a more homogenous excitation of the volume with fewer artifacts. The use of conventional, one-dimensional RF pulses also requires lower transmission power, thus greatly reducing the energy deposition in the object to be examined as compared with the standard method. Restrictions on the choice of slice shape due to SAR-limit values are therefore negligible. A further advantage of the inventive method is that, for example, in the simple case where nv=1 partial volume, the superimposed magnetic fields $B_{gradi}$, or their combination, can be allocated directly to a slice selection, read-out and phase gradient. In this way, conventional sequences can be transferred directly to the inventive method without time-consuming modifications. This also applies to the switching of additional gradients, such as slice refocusing, spoiler, or dephasing gradients.

Conventional slice selection by applying a superimposed magnetic field having a spatially linear dependence during irradiation of a simple RF pulse (e.g. sinc pulse) is a fast and efficient method for selecting a thin, or even a thick, planar slice. Extending this method by applying a first superimposed magnetic field $B_{grad1}$ with a spatially non-linear dependence permits the selection of a non-planar slice, or a curved volume while maintaining the speed and efficiency of the method. If, additionally, the superimposed magnetic field $B_{grad1}$ is obtained as a linear combination of field components with spatially linear and spatially non-linear dependences, the spatial dependence of $B_{grad1}$ can be specifically adapted by means of the amplitudes of the individual field components. Combining this with a corresponding adaptation of the bandwidth and the frequency offset of the RF pulse(s) results in a large degree of freedom to select the position, orientation as well as the curvature of the non-planar slice. To map the spin density in the region to be imaged of the object to be examined onto the midsurface of the selected non-planar slice, combinations of pairs of further superimposed magnetic fields $B_{gradi}$ (i>1) are used for spatial encoding according to the inventive method. These are selected in such a way that, over the total region to be imaged (nv=1), the gradients of at least one pair are aligned almost perpendicularly with respect to one another and with respect to the normal. If the required spatial dependence of the superimposed magnetic fields cannot be implemented for physical or hardware reasons, the slice volume is divided into nv>1 partial volumes. The number and shape is chosen such that, in each partial volume, at least one superimposed magnetic field pair exists whose gradients approximately fulfill the orthogonality criterion with respect to the normal of the midsurface. This enables the excited spin density to be projected onto the midsurface of the non-planar slice in each partial volume and thus—after application of a suitable reconstruction method—provides voxels of an almost rectangular shape that are aligned along the midsurface. As a result, the inventive method successfully applies the proven principle of linear imaging, by which orthogonal gradient fields are used for slice selection and subsequent spatial encoding, to non-linear imaging.

In one preferred embodiment of the inventive method, additional spatial encoding of the selected slice is performed using the first superimposed magnetic field $B_{grad1}$ along a respective axis that is locally aligned with the normal of the midsurface $A_M$ in the range −20° to 20°. Because of this additional spatial encoding that is nearly perpendicular to the midsurface, the excited slice is encoded in three dimensions, permitting division of the slice into corresponding subslices. These are characterized by the fact that, despite their curvature, they are seamlessly concatenated and thus map the excited slice volume while fully retaining a locally approximately rectangular voxel shape without overlapping. This embodiment of the inventive method also makes it possible to represent especially thin slices of the object to be examined.

Another preferred embodiment of the method is characterized in that the first superimposed magnetic field $B_{grad1}$ is varied over time and space during irradiation of the one or plurality of RF pulses. This makes it possible to excite a non-planar slice, whose shape deviates from that of a slice defined by a constant $B_{grad1}$ by combining one or more suitably adapted RF pulses. In this way, for example, the spatial dependence of the curvature or the spatial variation of the slice thickness can be changed.

Another special embodiment of the inventive method is characterized in that magnetization of the selected slice is prepared by one or more excitation, refocusing and/or saturation operations, wherein the non-linear first superimposed magnetic field $B_{grad1}$ is used with at least one RF pulse. Use of combinations of these known techniques of magnetization preparation increases, among other things, the flexibility of choice of volume selection.

The scope of this invention also includes an embodiment of the inventive method in which the temporal dependence of the amplitude and phase of the RF pulse or one or more of the RF pulses is adapted for each of the $n_S$ transmitter coils. Based on the varying position and spatially varying sensitivity of the $n_S$ transmitter coils, this embodiment enables specific adjustment of the RF pulse or pulses in a defined volume region. For example, it is possible to limit the excitation of a slice to a specific volume region. Particularly when using superimposed magnetic fields that result in the selection of multiple, doubly non-unique slices, this embodiment increases the flexibility of slice positioning. As part of the application of multi-dimensional RF pulses, this embodiment also permits subsampling of the transmission k-space. This permits, for example, the use of shorter RF pulses or a higher resolution of the volume to be selected.

Another preferred embodiment of the inventive method is characterized in that the local weighting and position of $n_E$ receiver coils is taken into account during signal reception and the differences between the individual receiver coils are used to reconstruct the image. This embodiment additionally permits reconstruction of MR signals for whose spatial encoding, non-unique encoding fields were used. The spin densities of identical spatial encoding are separated and assigned to the correct respective space, based on the differences between the signals of the individual receiver coils and their known sensitivity distributions. In technical implementation, the inverse of the encoding matrix is calculated by methods such as matrix inversion, for example. This extends the range of useful superimposed magnetic fields and the associated selection of slice shapes. In the case where multiple non-unique slices, which are positioned in such a way that both parts of the object to be examined are excited, this method can also used for allocating the spin density to the corresponding slice. This, in turn, increases flexibility during slice positioning.

Inclusion of this additional encoding information also permits the use of subsampled data and thus speeds up the acquisition process because fewer data points have to be acquired. Subsampling of the data results in folding-in of the image; different regions are superposed. The superposed regions can be separated using different signals from the individual receiver coils, for example, as part of a SENSE or GRAPPA reconstruction procedure.

In another embodiment of the inventive method, one of the superimposed magnetic fields allocated for spatial encoding in each partial volume is used for frequency encoding and another is used for phase encoding. For example, in the case where nv=1, these would be $B_{grad2}$ and $B_{grad3}$. This allocation permits, among other things, the use of standard sequences of two-dimensional imaging such as RARE, EPI or FLASH, which use one superimposed magnetic field for frequency encoding and one superimposed magnetic field for phase encoding.

Alternatively, in another embodiment, one or more of the superimposed magnetic fields allocated for spatial encoding in each partial volume are used for frequency encoding. This allows, among other things, the use of standard sequences of two-dimensional imaging, which use pure frequency encoding, for example, based on radial or spiral encoding.

In another alternative embodiment, one or more of the superimposed magnetic fields assigned for spatial encoding in the respective partial volume are used for phase encoding. This permits, among other things, the use of standard sequences of two-dimensional imaging, such as chemical shift imaging (CSI) or conventional spectroscopy sequences, which use pure phase encoding.

One embodiment of the inventive method, which also falls within the scope of this invention, is characterized in that the shape of the field components used corresponds to spherical harmonic coefficients of first or higher order. The shape of the spherical harmonic coefficients of first order is characterized by a spatially linear; that of the higher order, by a spatially non-linear dependence. The linear combination of spherical harmonic coefficients of different orders produces a wider range of possible field dependences, resulting in great flexibility in the choice of the slice shape. This embodiment additionally utilizes the properties of spherical harmonic coefficients that permit functions to be easily found whose gradients are globally mutually orthogonal, such as in the case of cylindrically symmetric functions. Consequently, for a first superimposed magnetic field $B_{grad1}$ chosen for slice selection, it is particularly easy to calculate two further linear combinations of spherical harmonics of first or higher order, whose gradients are globally perpendicular with respect to each other and with respect to the gradient of the first superimposed magnetic field $B_{grad1}$.

In an advantageous further development of this embodiment, the superimposed magnetic fields take the form:

$$B_{grad1}(x,y,z)=a_1{}^*x+b_1{}^*y+c_1{}^*z+d_1{}^*(x^2-y^2)+e_1{}^*(xy)$$

$$B_{grad2}(x,y,z)=a_2{}^*x+b_2{}^*y+c_2{}^*z+d_2{}^*(x^2-y^2)+e_2{}^*(xy)$$

$$B_{grad3}(x,y,z)=a_3{}^*x+b_3{}^*y+c_3{}^*z$$

where $a_i$, $b_i$, $c_i$, $d_i$ and $e_i$ denote the amplitudes of the respective field components. The individual superimposed magnet fields therefore represent a linear combination of the spherical harmonic coefficients of first order and of selected spherical harmonic coefficients of second order. Compared with terms of third or higher orders, in this embodiment of the inventive method, no complex supplementary terms, such as $z^*(x^2-y^2)$, are used. The resulting, simpler field distribution of the superimposed magnetic fields therefore permits especially simple selection of the slice to be excited. For example, the slice position for a given frequency offset can be varied directly via the amplitudes $a_1$, $b_1$ and $c_1$. These field components are also an obvious choice because they correspond either to conventional linear gradients or to field components of the shim system, so a design or assembly drawings are already available. Additionally, the associated field components are characterized by very high energy efficiency because the power requirement increases with the harmonic order. The organic slice shape resulting from the first superimposed magnetic field $B_{grad1}$ also corresponds to typical shapes in the human body.

Alternatively, in another embodiment of the inventive method, coil elements are available for producing $n_k$ ($n_k=n_{lin}+n_{nonlin}$) individual field components $n_g$, wherein $n_k$ individual field components are formed as the linear sum of the fields of $n_{gi}$ ($n_{gi}$ element N, $n_{gi}<=n_g$) respective coil elements. This method, which is also termed the matrix method, is characterized by an especially wide range of possible field shapes and thus especially great flexibility of choice of slice shape. The embodiment also enables production of superimposed magnetic fields that are limited to a selected region. This not only results in a reduced energy requirement but, due to this spatial limitation, it is also possible to minimize the global variation of the magnetic field. The latter also entails a reduction of the PNS risk (PNS=Peripheral Nerve Stimulation) and therefore permits a corresponding increase in the switching rate of the superimposed magnetic fields.

The individual coil element currents are determined by prescribing a target superimposed magnetic field according to the shape of the slice to be excited and subsequent solving of the associated linear system of equations by methods such as regulated matrix inversion. This method is also used to generate the further superimposed magnetic fields $B_{gradi}$ (i>1). The form of the associated target superimposed magnetic fields results, in turn, from the approximately fulfilled orthogonality criterion. If the latter cannot be fulfilled with the available hardware, slight adjustment of $B_{grad1}$, and thus also of the slice shape may be necessary.

An especially preferred embodiment of the inventive method is characterized in that the midsurface of each selected slice comprises a point cloud of points $P_n$ (n∈N, n>=4) where $B_{grad1}(P_n)^*\gamma$=frequency offset +/- 0.5 $BW_{RFpulse}$. By using a slice with an adjusted position, orientation and curvature, it is thus possible to select point clouds within a slice whose selection using conventional linear gradients would require time-consuming 3D encoding in the case of a thicker slice or multiple slices in the case of a comparable slice thickness. The inventive method therefore results in increased efficiency of the entire imaging process because less volume has to be selected and spatially encoded. Reformatting of the individual slices is also obviated. The inventive method also makes it possible to avoid sources of artifacts such as are presented by moving regions, by choosing the appropriate number of points $P_n$.

A further development of this embodiment is characterized in that the points $P_n$ correspond to those positions in the region to be imaged of the object to be examined that are to be mapped time-synchronously in an MR image. This enables direct, time-synchronous analysis of the various $P_n$ positions. This is particularly advantageous for the analysis of dynamic processes such as in fMRI (=functional magnetic resonance imaging). If the activation areas to be analyzed were located in different slices, it would first be necessary to perform complex time synchronization, which is not possible for some experiments.

An alternative to this embodiment is characterized in that the points $P_n$ correspond to those positions in the region to be imaged of the object to be examined that permit preferred spatial encoding on the basis of the different coil sensitivities. Such an adjustment of the slice shape to the sensitivity distribution of the various coils results in maximized generation of differences between the received signals of the individual receiver coils. This maximization of the additional information, in turn, permits the reconstruction of maximum subsampled data and therefore speeds up the acquisition process.

A special further development of these alternative embodiments is characterized in that the points $P_n$ correspond to sites on the visual cortex of a living organism and are aligned with the skull located above it. This makes it possible to analyze different activation areas of the visual cortex time-synchronously. It also means that fewer slices are required to cover the entire visual cortex as compared with the standard method.

The resulting reduced acquisition time makes it possible to analyze the visual cortex with higher time resolution.

Alternatively, the points $P_n$ correspond to the sites on the motor cortex of a living organism having the same orientation with respect to an anatomical landmark. An example of the latter would be the "Sulcus Centralis". In an analogous way to mapping of the visual cortex, this embodiment makes it possible to analyze different activation areas of the motor cortex time-synchronously. Again, the efficiency of the coverage is increased and makes a higher time resolution possible.

As a further alternative, the points $P_n$ correspond to sites on the spinal canal of a living organism. Adjustment of the slice curvature to the shape of the spinal canal in conjunction with the relevant encoding makes it possible to represent the latter in one slice. By adding multiple slices or one 3D-encoding, the spinal canal can also be represented with a higher spatial resolution or the entire spinal column can be represented with correct axial alignment.

Another alternative further embodiment is characterized in that the points $P_n$ correspond to sites on the joint structure of a living organism. By adapting the slice curvature to the curvature of a joint or structures inside the joint in combination with the inventive spatial encoding, these can also be represented with correct axial alignment and with maximum local resolution. Due to the flexibility of the slice selection it is also possible to examine the joint in different positions and thus examine it stretched and bent in different ways.

An alternative further embodiment is also noteworthy in which the points $P_n$ correspond to sites on the bone surface of a living organism. Thus, with the inventive method it is possible, for example, by suitable slice selection, to map the entire extent of a bone or a large part thereof in a single plane.

Another alternative further embodiment is characterized in that the points $P_n$ correspond to sites on the jaw of a living organism. Adjusting the slice shape to a jaw makes it possible to represent the entire jaw in one or few slices. This is especially advantageous in examinations of the gum or changes resulting from inflammation in the region of the tooth roots. In conventional imaging with linear gradients, selection of multiple slices or time-consuming 3D-encoding would be necessary. In the case of spatial encoding according to the standard method, the superposition of regions due to projection onto a plane would make analysis of the acquisition much more difficult. Furthermore, inventive adjustment of the slice shape to the jaw eliminates sources of artifacts, such as movement of the neck, for example.

Further advantages of the invention can be derived from the further description and the drawing. In accordance with the invention, the characteristics stated above and below can be used singly or in any combination. The embodiments shown and described are not an exhaustive list but are examples to explain the invention.

The invention is shown in the drawing and is explained in more detail using examples.

DESCRIPTION OF THE PREFERRED EMBODIMENT

Figure 1:
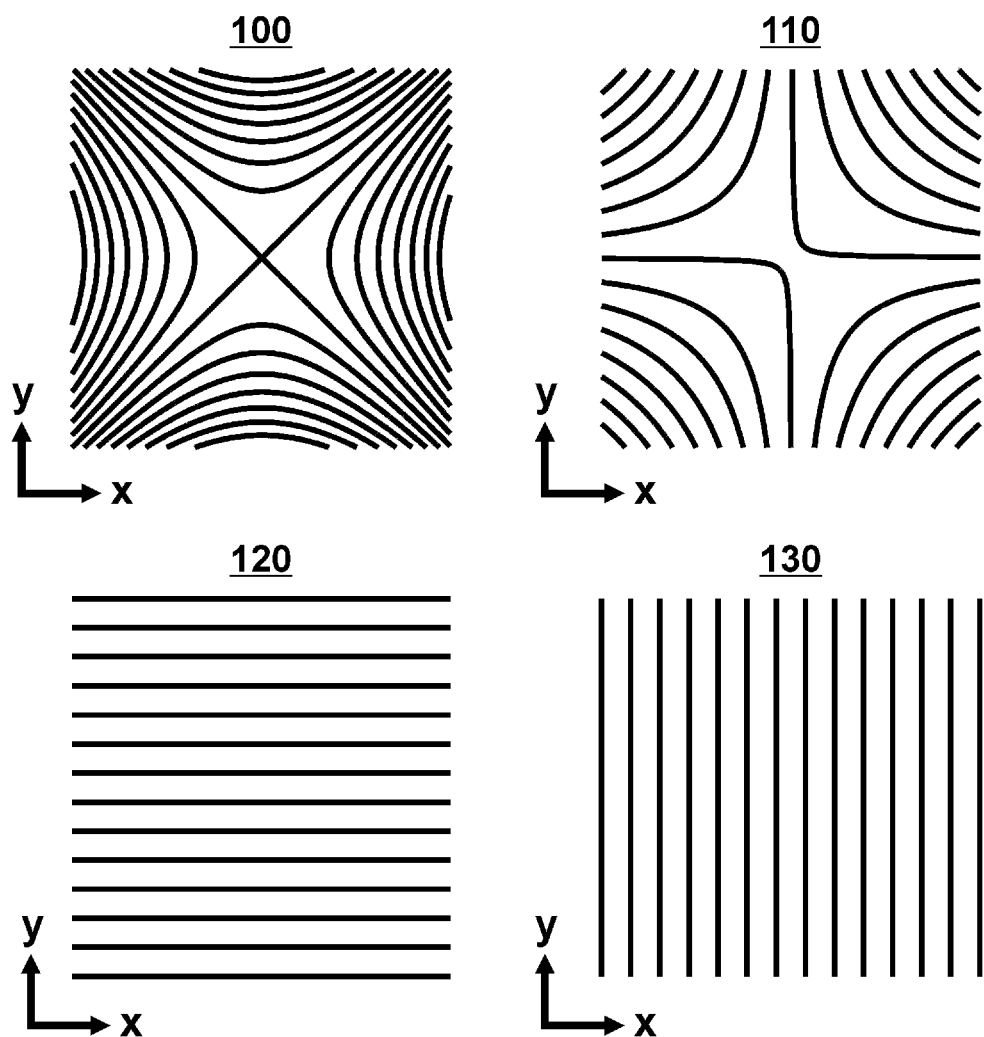
FIG. 1 The dependence of the isolines of four different field components in the x-y plane.

This invention relates to a further development of methods of magnetic resonance imaging that make selection and encoding of curved slices possible. It is based on the use of combinations of field components with spatially linear and spatially non-linear dependencies both for selection and also for spatial encoding of non-planar slices.

By applying a superimposed magnetic field during the irradiation of a one-dimensional RF pulse, it is possible to select a volume whose shape depends on the spatial dependence of the superimposed magnetic field and the frequency characteristics of the RF pulse. In a standard case of this process, named slice selection, with a spatially linear dependence of the superimposed magnetic field, the shape of the excited volume corresponds to a planar slice. If the superimposed magnetic field is composed of orthogonal field components, the orientation of the slice can be changed in any way by selecting a suitable amplitude. Spatial encoding with further superimposed magnetic fields whose gradients are orthogonally aligned with respect to each other and with respect to the normal of the midsurface of the slice results in unique mapping of the slice and in a rectangular voxel shape. This means that differing regions are not mapped at the same position and local resolution is maximized because of the voxel shape. Because all encoding gradients extend parallel with the midsurface of the selected slice, additional signal dephasing inside the slice, as is the case for non-parallel components, is avoided.

If the superimposed magnetic field applied for selection exhibits a spatially non-linear dependence, the shape of the selected volume deviates from the shape of a planar slice. Rotation of the volume is possible when the superimposed magnetic field is also composed of orthogonal field components and additional use of linear field components also permits a change in position of the volume. Such a method is known, for example, from [1].

An alternative to slice selection using one-dimensional RF pulses is the use of mufti-dimensional pulses. As is known from [13], this method also permits the excitation of curved slices, wherein the shape, orientation and position of the slice can be selected with a high degree of flexibility, which, in principle, enables adjustment to the structure of the object to be examined. However, selection using mufti-dimensional RF pulses is much more complex than with conventional, one-dimensional pulses. The limited time available for pulse irradiation due to relaxation processes, in particular, limits the resolution of the volume to be selected. Added to this is the risk of high energy deposition in the object to be examined, so that its application is severely restricted in practice.

Spatial encoding of a curved slice according to prior art also presents problems. In regions in which the gradients are not aligned orthogonally with the normal of the midsurface, encoding with conventional linear gradients results in distorted voxels associated with a reduced local resolution and additional signal dephasing. Depending on the degree of curvature, non-unique imaging is also possible. From [13] a special method for RF encoding of a curved slice is also known. As this is also based on multi-dimensional pulses, the associated problems remain. Furthermore, although the method permits elimination of non-unique imaging, the local resolution remains reduced because of a lack of alignment of the resulting voxels along the midsurface of the curved slice. In practice, spatial encoding with linear gradients having different orientations as described in [15] also only permits a rough approximation to an encoding along the midsurface of the curved surface.

The inventive method is based on the selection of curved slices by the application of a superimposed magnetic field with a spatially non-linear dependence during the irradiation of a one-dimensional RF pulse and subsequent spatial encoding by means of superimposed magnetic fields, which are aligned approximately perpendicularly with respect to one another and with respect to the normal of the midsurface of the curved slice. The inventive method is described by way of the following example of a case in which the excited slice volume is composed of nv=1 partial volumes and the spatial dependence of the field components used corresponds to spherical harmonic coefficients of first and second order.

FIG. 1 shows the dependence of lines of the same magnetic field strength (isolines) in the x-y plane of four of the five field components used in the example. The isolines of the field component 100 ($B(x,y,z)=x^2-y^2$) extend globally perpendicularly to the isolines of component 110 ($B(x,y,z)=2xy$). Both correspond to spherical harmonic coefficients of 2nd order and do not vary along the z-dimension. Their non-linear gradients are also globally perpendicular with respect to one another. The field components 120 ($B(x,y,z)=y$) and 130 ($B(x,y,z)=x$) together with component $B(x,y,z)=z$, which is not depicted, also exhibit global orthogonality. These three field components of first order correspond to the linear gradients of conventional spatial encoding.

Figure 2:
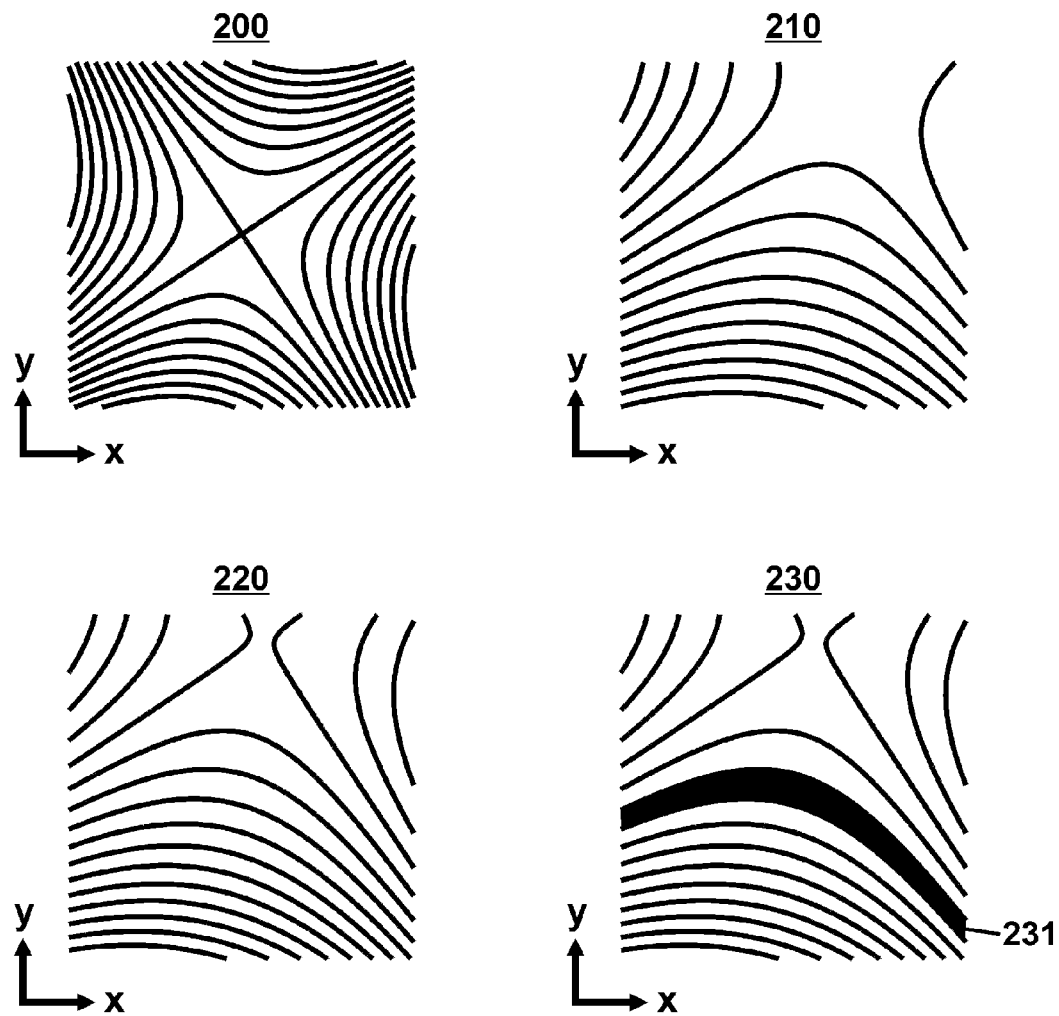
FIG. 2 The dependence of the isolines of the first superimposed magnetic field $B_{grad1}$ adjusted step by step and the cross-section of the resulting slice shape in the x-y plane.

FIG. 2 shows a first superimposed magnetic field $B_{grad1}$ 200, which comprises the two orthogonal field components 100 and 110. The field dependence corresponds to a rotation of field component 100 about the origin in the x-y plane. The angle of rotation is determined by the amplitude ratio of the two field components. Addition of the linear field component 120 results in a shift of the field in the y direction (210), additional addition of orthogonal linear component 130, a shift in the x-direction (220). The quadrupolar field can thus be rotated in any direction and shifted in the x-y plane via the amplitude ratio of all four field components. If the resulting first superimposed magnetic field $B_{grad1}$ 220 is produced during irradiation of an RF pulse (230), interaction with the spins is limited to the selected region 231. The position of the slice according to equation (2) is thus defined by the frequency offset, while the slice thickness is defined by the bandwidth of the pulse. For the first superimposed magnetic field $B_{grad1}$ presented in this example, the slice curvature increases the closer the slice is positioned to the center of the superimposed quadrupolar field. Modification of the slice curvature for a fixed position in real space is achieved by shifting the quadrupolar field and adapting the frequency offset accordingly. The selected region 231 therefore merely represents a cross-section of the curved slice, which extends constantly in the z-direction. Inclusion of the linear field component $B(x,y,z)=z$ in production of a first superimposed magnetic field $B_{grad1}$, would, in this case, permit additional inclination of the selected slice along the z axis.

Figure 3:
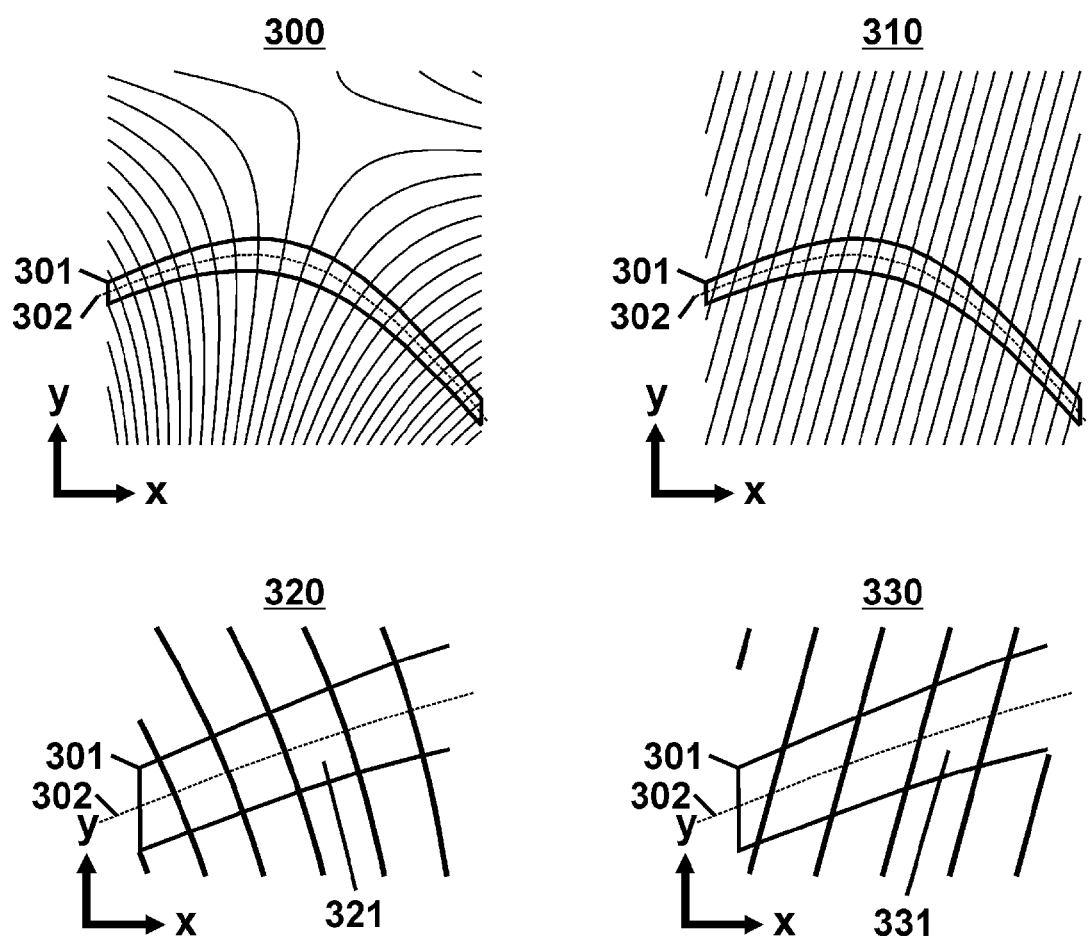
FIG. 3 The cross-section of a curved slice and the resulting voxel shape for two different encoding fields in the x-y plane.

According to the inventive method, spatial encoding is performed with superimposed magnetic fields whose gradients are aligned perpendicularly with respect to one another and with respect to the normal of the midsurface. The field dependence of the second superimposed magnetic field $B_{grad2}$ 300 referring to the example for encoding along the curved slice dimension is shown in FIG. 3. It is composed of the same field components as the first superimposed magnetic field $B_{grad1}$ 220, however with a different amplitude ratio. Encoding along the second dimension is performed in this case with the linear z gradient. Also shown is the perimeter 301 of the selected slice, as well as the dependence of the midsurface 302. Throughout the selected region, the isolines of the second superimposed magnetic field $B_{grad2}$ 300 used for encoding perpendicularly intersect the midsurface 302. The associated field gradient thus extends globally along the midsurface 302; the spin density is projected perpendicularly to the midsurface accordingly. The voxel shape can also be inferred from the dependence of slice 301 and of the isolines. As can be seen in the enlargement 320 of the left partial region, all voxels are characterized by a rectangular shape 321. Furthermore, all voxels are aligned along the midsurface. As a result, local resolution is optimized. Encoding with a conventional, linear superimposed magnetic field 310, which corresponds to the state of the art, would result in heavily distorted voxels 331 despite optimizing alignment, as the enlargement 330 provided for comparison purposes shows. The example demonstrates how a curved slice with variable orientation, position and curvature can be selected and subsequently encoded along its midsurface according to the inventive method.

Figure 5:
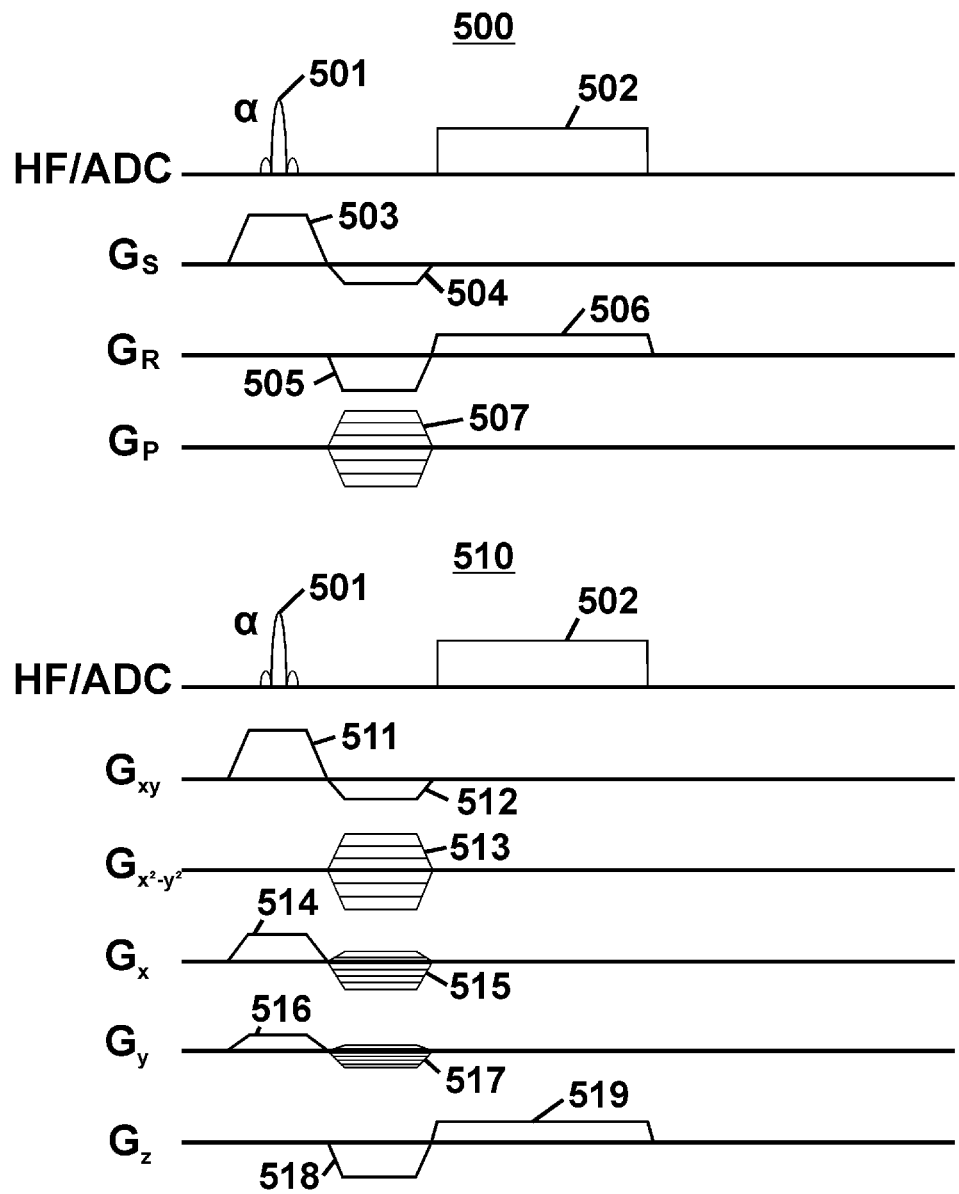
FIG. 5 A sequence diagram showing the switching of the superimposed magnetic fields and the associated field components.

For the special case in which the volume of the selected slice is composed of only nv=1 partial volume, the three superimposed magnetic fields used for selection and encoding can be directly assigned to a slice selection, phase encoding and read-out gradient. This allows the simple transfer of conventional sequences including their additional gradients such as slice refocusing, spoiler or dephasing gradients to the inventive method. FIG. 5 shows an example of a logical sequence diagram 500 for a gradient echo sequence (GE). It includes the amplitude dependencies for the slice selection ($G_S$), read ($G_R$) and phase encoding channel ($G_P$), as well as switching of the RF channel and ADC (analog-to-digital converter) for read-out the MR signal. During irradiation of the RF pulse 501 with flip angle α, the slice selection gradient 503 and subsequently the associated slice rephasing gradient 504 are switched. Rephasing of the MR signal is performed by read-out rephasing gradient 505. While the MR signal is being read out by the ADC 502, the read-out gradient 506 for spatial encoding along the non-curved slice dimension is switched. Spatial encoding along the curved slice dimension is performed with the phase encoding gradient 507. The physical sequence diagram 510 describes the associated amplitude dependencies of the individual field components. In the example sequence diagram shown here, the quadrupolar field is not rotated, but merely shifted in the x-direction and y-direction. In this case, the superimposed magnetic field assigned to the logical slice selection gradient 503 is only composed of the non-linear field component 110 ($B(x,y,z)=2xy$) and the two linear components 120 ($B(x,y,z)=y$) and 130 ($B(x,y,z)=x$). The amplitude 511, 514 and 516, with which the individual field components are switched during the slice selection process, is made possible by the amplitude of the slice selection gradient 503 and the amplitude ratio that characterizes the associated superimposed magnetic field. The amplitudes of the individual field components for switching the slice rephasing gradient 504 and phase encoding gradient 507 are determined analogously. This can result in superposition onto the physical channels caused by the time-synchronous switching of both logical gradients. The corresponding amplitude with which the field component is switched results from the sum of the individual contributions. In this example, this is the case for amplitudes 515 and 517 of the linear field components, while no superposition occurs for amplitudes 512 and 513 of the non-linear components. In this example, the superimposed magnetic field assigned to the logical read-out gradient is only composed of the linear field components (B(x,y,z)=z). The amplitudes 518 and 519 therefore result directly from the amplitudes 505 and 506.

Figure 4:
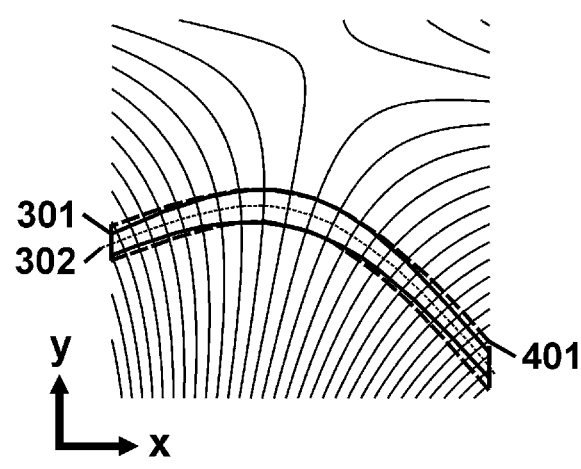
FIG. 4 A curved slice in the x-y plane having constant thickness.

FIG. 4 demonstrates a further embodiment of the inventive method, which uses mufti-dimensional RF pulses for slice selection. Compared with the selected curved slice 301 used with a one-dimensional pulse, a curved slice 401 with an even thickness but with the same midsurface 302 is now selected. According to the inventive method, in this case, too, spatial encoding is performed globally along the curved slice, as is illustrated by the isolines extending perpendicularly to the midsurface 302 of the superimposed magnetic field that is used for encoding.

REFERENCES

[1] U.S. Pat. No. 5,122,748.
[2] D. Gallichan, C. A. Cocosco, A. Dewdney, G. Schultz, A. Welz, J. Hennig, and M. Zaitsev, "Simultaneously driven linear and nonlinear spatial encoding fields in MRI," Magn Reson Med, vol. 65, pp. 702-714 (2011).
[3] J. L. Duerk, "Principles of MR image formation and reconstruction," Magn Reson Imaging Clin N Am, vol. 7, pp. 629-659, November 1999.
[4] D. J. Larkman and R. G. Nunes, "Parallel magnetic resonance imaging," Phys Med Biol, vol. 52, pp. R15-R55, April 2007.
[5] K. P. Pruessmann, M. Weiger, M. B. Scheidegger, and P. Boesiger, "SENSE: sensitivity encoding for fast MRI," Magn Reson Med, vol. 42, pp. 952-962, November 1999.
[6] U.S. Pat. No. 6,326,786.
[7] U.S. Pat. No. 6,841,998.
[8] M. A. Griswold, P. M. Jakob, R. M. Heidemann, M. Nittka, V. Jellus, J. Wang, B. Kiefer, and A. Haase, "Generalized autocalibrating partially parallel acquisitions (GRAPPA)," Magn Reson Med, vol. 47, pp. 1202-1210, June 2002.
[9] S. Y. Lee and Z. H. Cho, "Localized volume selection technique using an additional radial gradient coil," Magn Reson Med, vol. 12, pp. 56-63, October 1989.
[10] C. H. Oh, S. K. Hilal, Z. H. Cho, and I. K. Mun, "New spatial localization method using pulsed high-order field gradients (SHOT: Selection with High-Order gradienT)," Magn Reson Med, vol. 18, pp. 63-70, March 1991.
[11] E. X. Wu, G. Johnson, S. K. Hilal, and Z. H. Cho, "A new 3D localization technique using quadratic field gradients," Magn Reson Med, vol. 32, pp. 242-245, August 1994.
[12] P. Börnert and T. Schäffter, "Curved slice imaging," Magn Reson Med, vol. 36, pp. 932-939, December 1996.
[13] DE 696 32 302 T2.
[14] P. Börnert, "2D-RF-pulse-encoded curved-slice imaging," Magn Reson Mater Phy, vol. 16, pp. 86-92, July 2003.
[15] T. H. Jochimsen and D. G. Norris, "Single-shot curved slice imaging," Magn Reson Mater Phy, vol. 14, pp. 50-55, March 2002.

We claim:

1. A method of magnetic resonance (=MR) configured for imaging an object, the method comprising the steps of:
   a) applying, using a gradient system, a magnetic field $B_{grad}$ that is variable over time and space that permits spatial selection of a region of the object to be imaged and permits at least two-dimensional spatial encoding of MR signals in the region of the object to be imaged, the magnetic field $B_{grad}$ having $n_{lin}$ field components with a spatially linear and $n_{nonlin}$ field components with a spatially non-linear dependence, wherein $n_{lin}+n_{nonlin} \geq 1$, an amplitude and spatial dependence of $B_{grad}$ being controlled by means of a strength and ratio of amplitudes of individual field components, wherein the magnetic field $B_{grad}$ is applied during a single measurement cycle from excitation to read-out, of the MR signals, using at least three magnetic fields $B_{gradi}$ superimposed on the region of the object to be imaged, wherein a first superimposed magnetic field $B_{grad1}$ has a spatially non-linear dependence;
   b) transmitting, using an RF transmitter system with $n_S$ transmitter coils, where $n_S \geq 1$, at least one RF (=radiofrequency) pulse, wherein a volume of at least one curved slice is selected by applying the first superimposed magnetic field $B_{grad1}$ during irradiation of the at least one RF pulse; and
   c) receiving, using an RF receiver system with $n_E$ receiver coils, where $n_E \geq 1$, RF signals transmitted by the object, wherein a position and orientation of the curved slice, a degree of curvature and a thickness of the slice are selected via an amplitude, a spatial dependence of the first superimposed magnetic field $B_{grad1}$, a magnitude of a frequency offset and a temporal dependence of the at least one RF pulse, wherein a position, orientation and curvature of the slice are described via a mid-surface $A_M$ thereof, with $B_{grad1}$ ($A_M$)=gyromagnetic ratio $\gamma^*$frequency offset, a thickness of the slice being defined by a respective extent of the slice along a normal of the mid-surface $A_M$, wherein a volume of the selected slice is composed of $n_v$ partial volumes and, in each partial volume, gradients of at least one pair of remaining superimposed magnetic fields $B_{gradi}$ (i>1) exhibit an angle dependence of 70° to 110° with respect to one another and with respect to the normal of the mid-surface $A_M$ within the partial volume, wherein at least one superimposed magnetic field, of the respective superimposed magnetic field pair, exhibits a spatially non-linear dependence, combinations of these pairs being used in at least two-dimensional spatial encoding of the MR signal along the mid-surface $A_M$ of the selected slice; and
   d) reconstructing, from the received magnetic resonance signals of step c), by means of a reconstruction processor that is part of a magnetic resonance system, at least one selected and spatially-encoded, curved magnetic resonance slice that is generated and displayed, in a form that successfully maps the at least one curved magnetic resonance slice, in an image format with the image pixels/voxels being fully characterized by a substantially rectangular pixel/voxel shape.

2. The method of claim 1, wherein additional spatial encoding of the selected slice is performed using the first superimposed magnetic field $B_{grad1}$ along a respective axis that is aligned with the normal of the mid-surface $A_M$ locally in the range −20° to 20°.

3. The method of claim 1, wherein the superimposed first magnetic field $B_{grad1}$ is varied over time and space during irradiation of the at least one RF pulse.

4. The method of claim 1, wherein a magnetization of the selected slice is prepared by one or more excitation, refocusing and/or saturation operations, wherein the non-linear first superimposed magnetic field $B_{grad1}$ is used with at least one RF pulse.

5. The method of claim 1, wherein a temporal dependence of an amplitude and phase of the at least one RF pulse is adjusted with respect to each of the $n_S$ transmitter coils.

6. The method of claim 1, wherein a local weighting and position of $n_E$ receiver coils is taken into account during signal reception and differences between the individual receiver coils are used in order to reconstruct the image.

7. The method of claim 1, wherein one of the superimposed magnetic fields allocated for the spatial encoding in each partial volume is used for frequency encoding and another one of the superimposed magnetic fields is used for phase encoding.

8. The method of claim 1, wherein one or more of the superimposed magnetic fields allocated for the spatial encoding in each partial volume is used for frequency encoding.

9. The method of claim 1, wherein one or more of the superimposed magnetic fields allocated for the spatial encoding in each partial volume is used for phase encoding.

10. The method of claim 1, wherein a shape of the field components used corresponds to polynomials of first and higher order in (x,y,z) coordinate notation.

11. The method of claim 10, wherein the superimposed magnetic fields take the form:

$$B_{grad1}(x,y,z)=a_1*x+b_1*y+c_1*z+d_1*(x^2-y^2)+e_1*(xy)$$

$$B_{grad2}(x,y,z)=a_2*x+b_2*y+c_2*z+d_2*(x^2-y^2)+e_2*(xy)$$

$$B_{grad3}(x,y,z)=a_3*x+b_3*y+c_3*z$$

where $a_i$, $b_i$, $c_i$, $d_i$ and $e_i$ denote amplitudes of respective field components.

12. The method of claim 1, wherein $n_g$ coil elements are available for producing $n_k$ ($n_k=n_{lin}+n_{nonlin}$) individual field components, wherein the $n_k$ individual field components are formed as a linear sum of fields of $n_{gi}$ ($n_{gi}$ element N, $n_{gi}<=n_g$) respective coil elements.

13. The method of claim 1, wherein the mid-surface of the respective selected slice comprises a point cloud of points $P_n$, n ∈N, n>=4) where $B_{grad1}(P_n)*Y$=frequency offset +/− 0.5 $BW_{RF-pulse}$.

14. The method of claim 13, wherein points $P_n$ correspond to positions in the region of the object to be imaged, that are to be imaged time-synchronously.

15. The method of claim 13, wherein the points $P_n$ correspond to positions in the region of the object to be imaged that permit a preferred spatial encoding based on different receiver coil sensitivities.

16. The method of claim 13, wherein the points $P_n$ correspond to sites on a visual cortex of a living organism and are aligned with a skull located above said visual cortex.

17. The method of claim 13, wherein the points $P_n$ correspond to sites on a motor cortex of a living organism having a same orientation with respect to an anatomical landmark.

18. The method of claim 13, wherein the points $P_n$ correspond to sites on a spinal canal of a living organism.

19. The method of claim 13, wherein the points $P_n$ correspond to sites on a joint structure of a living organism.

20. The method of claim 13, wherein the points $P_n$ correspond to sites on a bone surface of a living organism.

21. The method of claim 13, wherein the points $P_n$ correspond to sites on a jaw of a living organism.

* * * * *